US012719007B2

(12) United States Patent
Wright

(10) Patent No.: US 12,719,007 B2
(45) Date of Patent: Aug. 25, 2026

(54) ION SOURCE CONTAINING A SPUTTER TARGET

(71) Applicant: Applied Materials, Inc., Santa Clara, CA (US)

(72) Inventor: Graham Wright, Newburyport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 334 days.

(21) Appl. No.: 18/238,884

(22) Filed: Aug. 28, 2023

(65) Prior Publication Data

US 2025/0079113 A1 Mar. 6, 2025

(51) Int. Cl.
*H01J 37/08* (2006.01)
*H01J 37/317* (2006.01)

(52) U.S. Cl.
CPC .......... *H01J 37/08* (2013.01); *H01J 37/3171* (2013.01); *H01J 2237/081* (2013.01)

(58) Field of Classification Search
CPC ... H01J 37/08; H01J 37/3171; H01J 2237/081
See application file for complete search history.

(56) References Cited

U.S. PATENT DOCUMENTS

| | | | |
|---|---|---|---|
| 8,253,114 | B2 | 8/2012 | Yamashita et al. |
| 10,290,461 | B1 | 5/2019 | Tieger et al. |
| 10,529,532 | B2 | 1/2020 | Yuze et al. |
| 10,600,611 | B2 | 3/2020 | Becker et al. |
| 10,896,799 | B1 | 1/2021 | Becker et al. |
| 2015/0144808 | A1 | 5/2015 | Ribton et al. |
| 2018/0138020 | A1 | 5/2018 | Koo et al. |
| 2019/0180971 | A1 | 6/2019 | Becker et al. |
| 2020/0090916 | A1 | 3/2020 | Patel et al. |
| 2022/0199351 | A1 | 6/2022 | Yen et al. |
| 2022/0319796 | A1 | 10/2022 | Drummond et al. |

FOREIGN PATENT DOCUMENTS

| | | | |
|---|---|---|---|
| CN | 115241033 | A | 10/2022 |
| TW | 201403648 | A | 1/2014 |
| TW | 201937521 | A | 9/2019 |
| TW | 202223960 | A | 6/2022 |
| WO | 2009/152127 | A2 | 12/2009 |
| WO | 2019/118120 | A1 | 6/2019 |
| WO | 2020/185348 | A1 | 9/2020 |

OTHER PUBLICATIONS

International Search Report and Written Opinion mailed Oct. 28, 2024 in corresponding PCT application No. PCT/US2024/038651.

*Primary Examiner* — Georgia Y Epps
*Assistant Examiner* — Hanway Chang
(74) *Attorney, Agent, or Firm* — Nields, Lemack & Frame, LLC

(57) ABSTRACT

An ion source with a sputter target located at the end of the ion source is disclosed. The ion source may include an indirectly heated cathode and the sputter target may be disposed on the end opposite the cathode. The ion source may contain one or more side electrodes, wherein at least one of these electrodes is electrically biased relative to the arc chamber. In one embodiment, the second end of the ion source is made of a dopant containing material and serves as the sputter target. In another embodiment, there is an opening in the second end, and an insert is disposed in this opening. The insert is made of a dopant containing material and serves as the sputter target.

16 Claims, 4 Drawing Sheets

ION SOURCE CONTAINING A SPUTTER TARGET

FIELD

Embodiments of the present disclosure relate to an ion source that includes a dopant containing material located on the wall opposite the cathode.

BACKGROUND

Various types of ion sources may be used to create the ions that are used in semiconductor processing equipment. For example, an indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller is typically disposed on the end of the arc chamber opposite the cathode. The cathode and repeller may be biased so as to repel the electrons, directing them back toward the center of the arc chamber. In some embodiments, a magnetic field is used to further confine the electrons within the arc chamber.

In certain embodiments, electrodes are also disposed on one or more side walls of the arc chamber. These electrodes may be positively or negatively biased so as to control the position of ions and electrons, so as to increase the ion density near the center of the arc chamber. An extraction aperture is disposed along another side, proximate the center of the arc chamber, through which the ions may be extracted. These biased side electrodes may also negate the need for a repeller on the end wall for electron confinement.

In certain embodiments, it may be desirable to utilize a feed material that is in solid form as a dopant species. However, there are issues associated with using solid feed materials with IHC ion sources. For example, vaporizers used with ion sources are difficult to operate at temperatures greater than 1200 Celsius. Further, there may be issues with heat shielding and condensation in the tubes that connect the vaporizer with the arc chamber. These issues may prevent the use of many solids in a vaporizer because their vapor pressure is too low at 1200 Celsius.

Further, solid sputter targets disposed within the arc chamber may have limited feasibility due to low melting temperatures and limited life due to size constraints.

Therefore, it would be advantageous if there were an ion source that allows for a larger solid sputter target to be disposed within the arc chamber.

SUMMARY

An ion source with a sputter target located at the end of the ion source is disclosed. The ion source may include an indirectly heated cathode and the sputter target may be disposed on the end opposite the cathode. The ion source may contain one or more side electrodes, wherein at least one of these electrodes is electrically biased relative to the arc chamber. In one embodiment, the second end of the ion source is made of a dopant containing material and serves as the sputter target. In another embodiment, there is an opening in the second end, and an insert is disposed in this opening. The insert is made of a dopant containing material and serves as the sputter target.

According to one embodiment, an indirectly heated cathode (IHC) ion source to create an ion beam comprising a dopant species is disclosed. The IHC ion source comprises an arc chamber, comprising a plurality of electrically conductive side walls connecting a first end and a second end; an indirectly heated cathode disposed on the first end of the arc chamber; an electrode disposed on one of the plurality of electrically conductive side walls, wherein a voltage is applied to the electrode relative to a voltage applied to the plurality of electrically conductive side walls of the arc chamber; and wherein the second end is electrically connected to the side walls and is made of a dopant containing material. In some embodiments, the indirectly heated cathode is electrically connected to the side walls. In some embodiments, the dopant containing material has a melting point greater than a melting point of the dopant species. In some embodiments, the dopant species is a metal and the dopant containing material is a ceramic containing the dopant species or an alloy containing the dopant species. In some embodiments, the second end is at least 0.5 inches thick. In some embodiments, the dopant species is aluminum and the dopant containing material is a ceramic containing aluminum or an aluminum alloy.

According to another embodiment, an ion implanter is disclosed. The ion implanter comprises any of the IHC ion sources described above, and one or more beamline components to direct the ion beam toward a workpiece. In some embodiments, the indirectly heated cathode is electrically connected to the side walls. In some embodiments, the dopant species is aluminum and the dopant containing material is a ceramic containing aluminum or an aluminum alloy.

According to another embodiment, an indirectly heated cathode (IHC) ion source to generate an ion beam comprising a dopant species is disclosed. The ion source comprises an arc chamber, comprising a plurality of electrically conductive side walls connecting a first end and a second end; an indirectly heated cathode disposed on the first end of the arc chamber; an electrode disposed on one of the plurality of electrically conductive side walls, wherein a voltage is applied to the electrode relative to a voltage applied to the plurality of electrically conductive side walls of the arc chamber; and wherein an opening is disposed in the second end, and an insert made from a dopant containing material is disposed in the opening and electrically connected to the second end. In some embodiments, the indirectly heated cathode is electrically connected to the side walls. In some embodiments, the dopant containing material has a melting point greater than a melting point of the dopant species. In some embodiments, the dopant species is a metal and the dopant containing material is a ceramic containing the dopant species or an alloy containing the dopant species. In some embodiments, the insert is at least 0.5 inches thick. In some embodiments, the dopant species is aluminum and the dopant containing material is a ceramic containing aluminum or an aluminum alloy. In some embodiments, the insert completely fills the opening. In some embodiments, a gap exists between the opening and the insert. In some embodiments, a holder is disposed at an exterior surface of the second end to retain the insert in position within the opening.

According to another embodiment, an ion implanter is disclosed. The ion implanter comprises any of the IHC ion sources described above, and one or more beamline components to direct the ion beam toward a workpiece.

According to another embodiment, an ion implanter is disclosed. The ion implanter comprises an ion source; and one or more beamline components to direct an ion beam toward a workpiece, wherein the ion source comprises: an arc chamber, comprising a plurality of electrically conductive side walls connecting a first end and a second end; a plasma generator disposed on the first end of the arc chamber; an electrode disposed on one of the plurality of electrically conductive side walls, wherein a voltage is applied to the electrode relative to a voltage applied to the plurality of electrically conductive side walls of the arc chamber; and wherein the second end is electrically connected to the side walls and is made of a dopant containing material or wherein an opening is disposed in the second end, and an insert made from the dopant containing material is disposed in the opening.

BRIEF DESCRIPTION OF THE FIGURES

For a better understanding of the present disclosure, reference is made to the accompanying drawings, which are incorporated herein by reference and in which.

DETAILED DESCRIPTION

As described above, vaporizers may be problematic at very high temperatures due to condensation and low vapor pressure.

Figure 1:
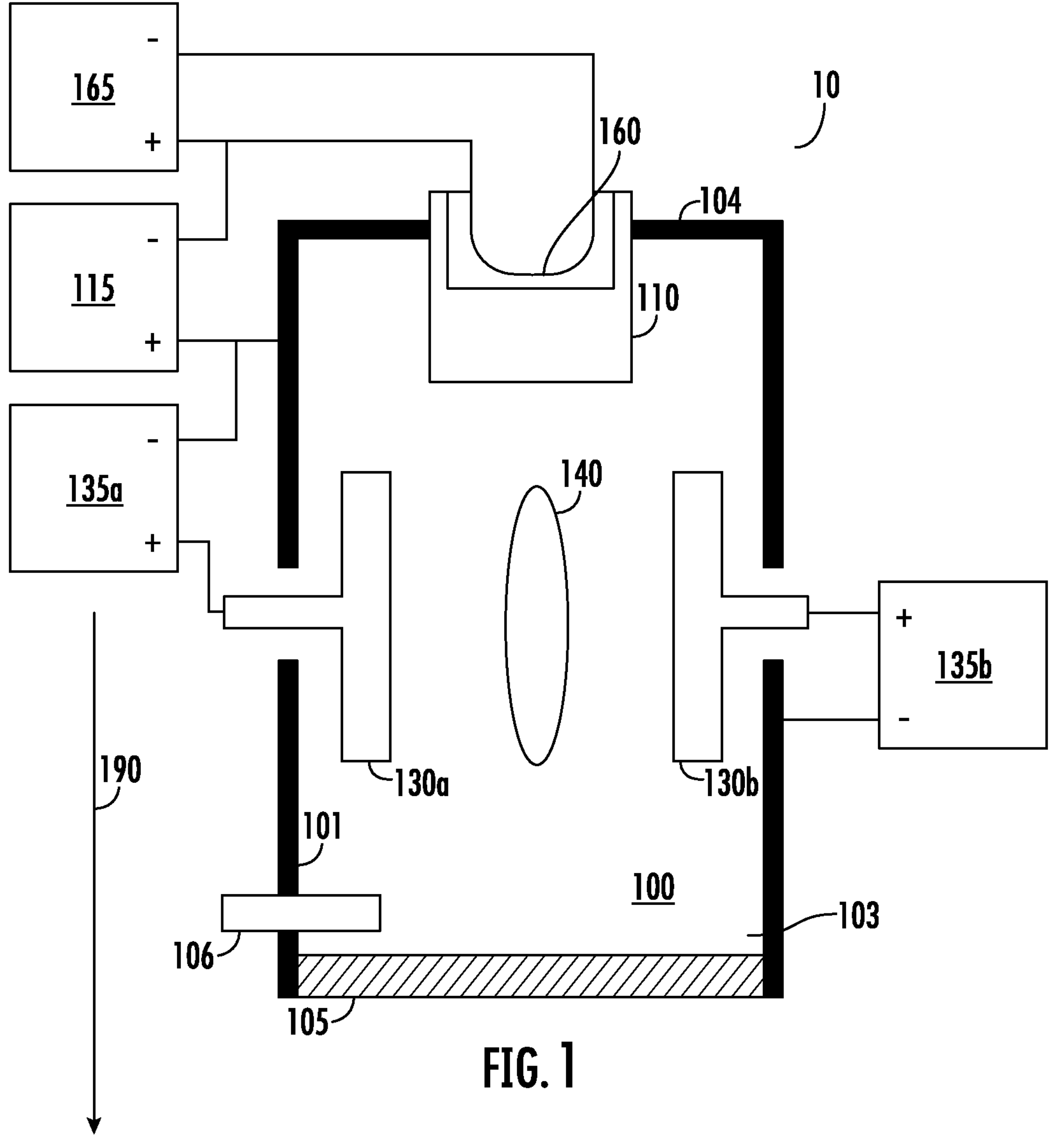
FIG. 1 shows a first embodiment of an ion source having a sputter target disposed at the second end.

FIG. 1 shows an IHC ion source 10 that overcomes these issues. The IHC ion source 10 includes an arc chamber 100, comprising two opposite ends, and side walls 101 connecting to these ends. The arc chamber 100 also includes a bottom wall and a top wall. The walls of the arc chamber 100 may be constructed of an electrically conductive material and may be in electrical communication with one another. In some embodiments, the walls are made of graphite or tungsten. A cathode 110 is disposed in the arc chamber 100 at a first end 104 of the arc chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 500V more negative than the voltage of the cathode 110. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. In certain embodiments, the cathode 110 may be electrically connected to the arc chamber 100, so as to be at the same voltage as the side walls of the arc chamber 100. In these embodiments, the cathode 110 may be electrically connected to the side walls of the arc chamber 100. In certain embodiments, the arc chamber 100 is connected to electrical ground.

In this embodiment, the second end 105 of the arc chamber 100 opposite the cathode 110 is constructed from a dopant containing material. The dopant containing material is a solid material and may have a melting temperature that is greater than the temperatures experienced within the arc chamber 100. Further, the dopant containing material may have a higher melting point than the dopant species. For example, if the desired dopant species is aluminum, the second end 105 may be constructed from an aluminum containing ceramic, such as AlN, or an aluminum containing alloy, such as aluminum tantalum. Other dopants may be used. For example, the dopant species may be a metal, such as gallium, lanthanum, indium and others. If these other dopant species are used, ceramics that include the dopant species or alloys that include the dopant species may be used. In this embodiment, the entirety of the second end 105 is made of the dopant containing material. Thus, in this embodiment, the second end 105 serves as the sputter target. This second end 105 may be secured to the arc chamber 100 in the manner typically used, such as by compression or clamping forces. The second end 105 is electrically connected to the rest of the walls of the arc chamber 100. Thus, in certain embodiments, the second end 105 is electrically grounded.

In certain embodiments, a magnetic field 190 is generated in the arc chamber 100. This magnetic field is intended to confine the electrons along one direction. The magnetic field 190 typically runs parallel to the side walls 101 from the first end 104 to the second end 105.

In the embodiment shown in FIG. 1, first electrode 130*a* and second electrode 130*b* may be disposed on respective opposite side walls 101 of the arc chamber 100, such that the first electrode 130*a* and the second electrode 130*b* are within the arc chamber 100. The first electrode 130*a* and the second electrode 130*b* may be configured so as to be electrically isolated from the side walls 101. The first electrode 130*a* and the second electrode 130*b* may each be biased by a respective power supply. In certain embodiments, the first electrode 130*a* and the second electrode 130*b* may be in communication with a common power supply. However, in other embodiments, to allow maximum flexibility and ability to tune the output of the IHC ion source 10, the first electrode 130*a* may be in communication with a first electrode power supply 135*a* and the second electrode 130*b* may be in communication with a second electrode power supply 135*b*.

The first electrode power supply 135*a* and the second electrode power supply 135*b* serve to bias the first electrode 130*a* and the second electrode 130*b*, respectively, relative to the side walls 101 of the arc chamber 100. In certain embodiments, the first electrode power supply 135*a* and the second electrode power supply 135*b* may bias the first electrode 130*a* and the second electrode 130*b* positively or negatively relative to the side walls 101 of the arc chamber 100. In certain embodiments, at least one of the electrodes may be biased at between 40 and 500 volts relative to the side walls 101 of the arc chamber 100.

While FIG. 1 shows two electrodes 130*a*, 130*b*, it is understood that one of these electrodes, such as second electrode 130*b* and its associated second electrode power supply 135*b* may be eliminated in some embodiments. In another embodiment, the second electrode 130*b* is disposed within the arc chamber 100, but is electrically connected to the side walls 101 of the arc chamber 100. Thus, in this embodiment, the second electrode power supply 135*b* may be eliminated.

The cathode 110 and the electrodes 130*a*, 130*b* are made of an electrically conductive material, such as a metal or graphite.

Disposed on another side of the arc chamber 100, referred to as the top wall 103, may be an extraction aperture 140. In FIG. 1, the extraction aperture 140 is disposed on a side that is parallel to the page. Further, the IHC ion source 10 also comprises a gas inlet 106 through which the gas to be ionized is introduced to the arc chamber 100.

During operation, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the arc chamber 100. These electrons collide with the molecules of gas that are fed into the arc chamber 100 through the gas inlet 106. A carrier gas, such as argon, or an etching gas, such as fluorine-based or chlorine-based gasses, may be introduced into the arc chamber 100 through a suitably located gas inlet 106. The combination of electrons from the cathode 110, the gas and the positive potential creates a plasma. The plasma may be confined and manipulated by the electrical fields created by the first electrode 130*a* and the second electrode 130*b*. Further, in certain embodiments, the electrons and positive ions may be somewhat confined by the magnetic field 190. In certain embodiments, the plasma is confined near the center of the arc chamber 100, proximate the extraction aperture 140. In some embodiments, the plasma may be biased at a voltage which is close to the average of the voltages applied to the first electrode 130*a* and the second electrode 130*b*. Chemical etching or sputtering by plasma transforms the second end 105 into the gas phase and causes ionization. The ionized feed material can then be extracted through the extraction aperture 140 and used to prepare an ion beam that comprises the dopant species.

In certain embodiments, the voltage of the cathode 110 is less positive than the voltage of the plasma. For example, in one embodiment, the cathode 110 may be at the same voltage as the side walls of the arc chamber 100. The first electrode 130*a* may be biased at 150V, while the second electrode 130*b* may be biased at 0V or 20V. Thus, the electrons generated by the cathode 110 are attracted toward the plasma. In some embodiments, these emitted electrons or other particles may also strike the second end 105, causing it to sputter.

Neutral atoms that are sputtered or otherwise released from the second end 105 are launched toward the plasma, where they can be ionized by the confined electrons and extracted through the extraction aperture 140.

In this embodiment, the second end 105 may be manufactured to have a desired initial thickness. For example, in certain embodiments, the arc chamber 100 is dimensioned such that the second end 105 may have a thickness of 0.5 inches or more. Specifically, the outer surface of the second end 105 (which is opposite that facing the arc chamber 100), may extend outward significantly, limited only by the configuration of components outside the arc chamber 100. This may provide extended lifetime of the IHC ion source 10 before the second end is replaced. As the second end 105 is sputtered, its thickness decreases, slightly increasing the volume of the arc chamber 100.

Figure 2:
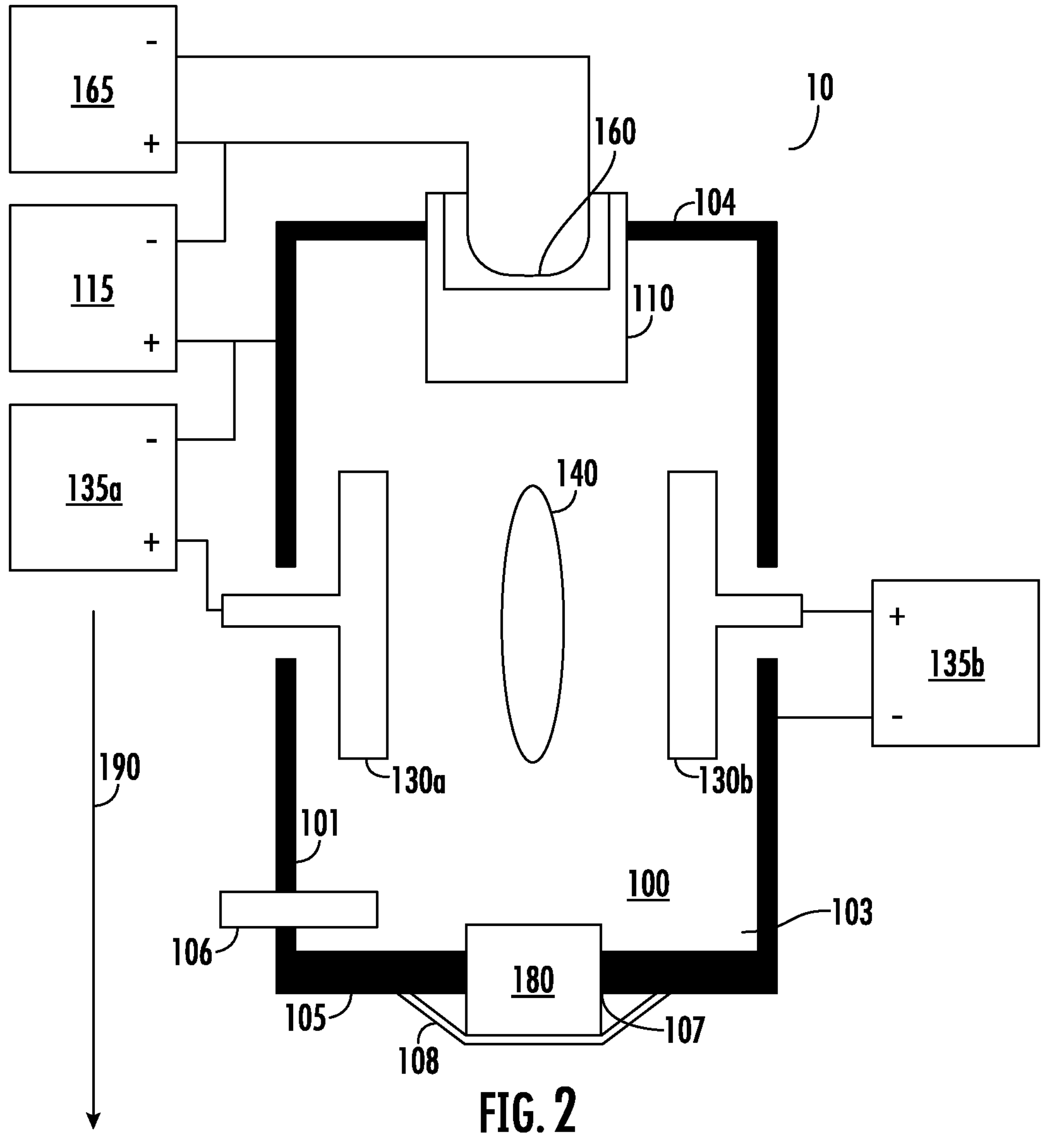
FIG. 2 shows a second embodiment of an ion source having a sputter target disposed at the second end.

FIG. 2 shows a second embodiment. Many of the components in this embodiment are identical to those in FIG. 1 and have been given identical reference designators.

In this embodiment, the second end 105 may be constructed from the same material as the other walls, which may be graphite or tungsten. The second end 105 is electrically connected to the side walls 101 and in certain embodiments, may be grounded.

An opening 107 is created in the second end 105, such as in the center of the second end 105, aligned with the cathode 110. An insert 180 may then be disposed into this opening 107 such that a portion of the insert 180 is disposed within the arc chamber 100. Since the insert 180 is affixed to the second end 105, it is at the same voltage as the second end and may also be grounded. The insert 180 is made from the dopant containing material. As described above, the dopant containing material may be a solid and may have a higher melting temperature than the temperatures experienced within the arc chamber 100. Further, the dopant containing material may have a melting temperature greater than that of the dopant species. If aluminum is the dopant species, the dopant containing material may be an aluminum alloy or a ceramic made from aluminum. Further, as described above, the dopant species may be a metal, such as gallium, lanthanum, indium and others. If these other dopant species are used, ceramics that include the dopant species or alloys that include the dopant species may be used. Thus, in this embodiment, the insert 180 serves as the sputter target.

Figure 3A:
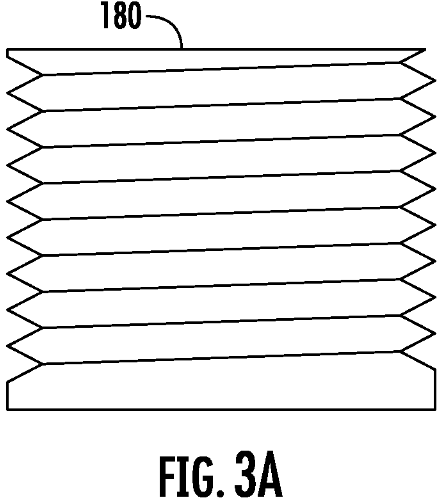
FIGS. 3A-3B show the insert used with FIG. 2 according to two embodiments.

In some embodiments, the opening 107 may be circular, and the insert 180 may be a cylindrical shape. As shown in FIG. 3A, in certain embodiments, the opening 107 may be threaded. Similarly, the insert 180 may also be threaded, allowing the insert 180 to be easily installed and removed from the arc chamber 100 without having to disassemble the IHC ion source 10. Further, the insert 180 may be longer than 0.5 inches, where a portion of the insert 180 is disposed within the arc chamber 100, and a second portion is disposed outside the arc chamber 100. Thus, if it is threaded, as the insert 180 is consumed, it may be rotated so as to further extend the insert 180 into the arc chamber 100 such that the second portion is now inside the arc chamber 100.

In other embodiments, the opening 107 and the insert 180 may have a different shape, such as rectangular, hexagonal, triangular or any other shape. Furthermore, other mechanisms for holding the insert 180 may be used. In one embodiment, as shown in FIG. 2, a holder 108 may be installed on the exterior surface of the second end 105, which is used to position and retain the insert 180. The holder 108 may be adjustable such that the portion of the insert 180 that remains outside the arc chamber 100 may be modified as the insert 180 is consumed. The holder 108 may be in the form of a bracket, a clamp, a bolt, or another fastener. In some embodiments, such as that shown in FIG. 2, the insert 180 may have the same cross-section through its length such that all portions of the insert 180 can pass through the opening 107.

Figure 3B:
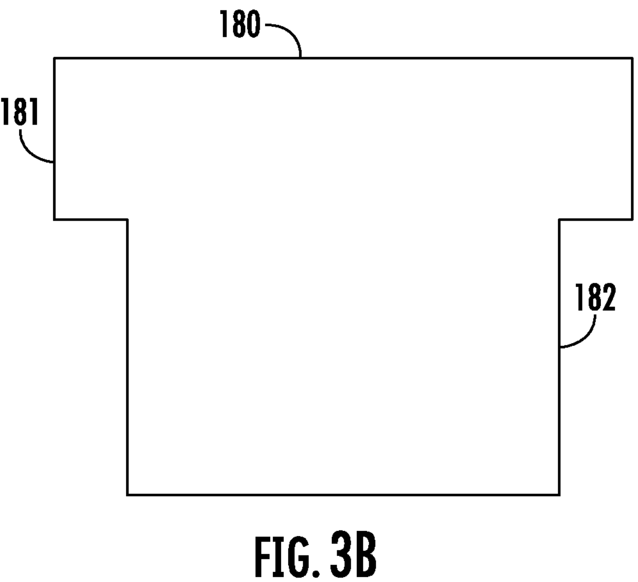

In another embodiment, shown in FIG. 3B, the insert 180 may have a head 181 with a larger outer dimension than the body 182. In this way, the insert 180 may be installed such that the head 181 is disposed in the arc chamber 100. The head 181, since its outer dimension is larger than the opening 107, retains the insert 180 in the arc chamber 100. In this embodiment, the insert 180 may be cylindrical, hexagonal, a rectangular prism or a cube. This embodiment may not utilize a holder 108. In all instances, the insert 180 and the second end 105 may be electrically connected and may be grounded.

In certain embodiments, the insert 180 may completely fill the opening 107 so as to seal the arc chamber 100. However, in some embodiments, there may be a gap between the insert 180 and the second end 105 at the opening 107. However, the insert 180 remains at the same potential as the second end 105, regardless of whether there is a gap or not.

While the above disclosure describes the use of a sputter target with an indirectly heated cathode ion source, it is understood that the disclosure is not limited to this embodiment. The ion source may be any type of ion source, such as an RF ion source, a Bernas ion source or any other type.

Figure 4:
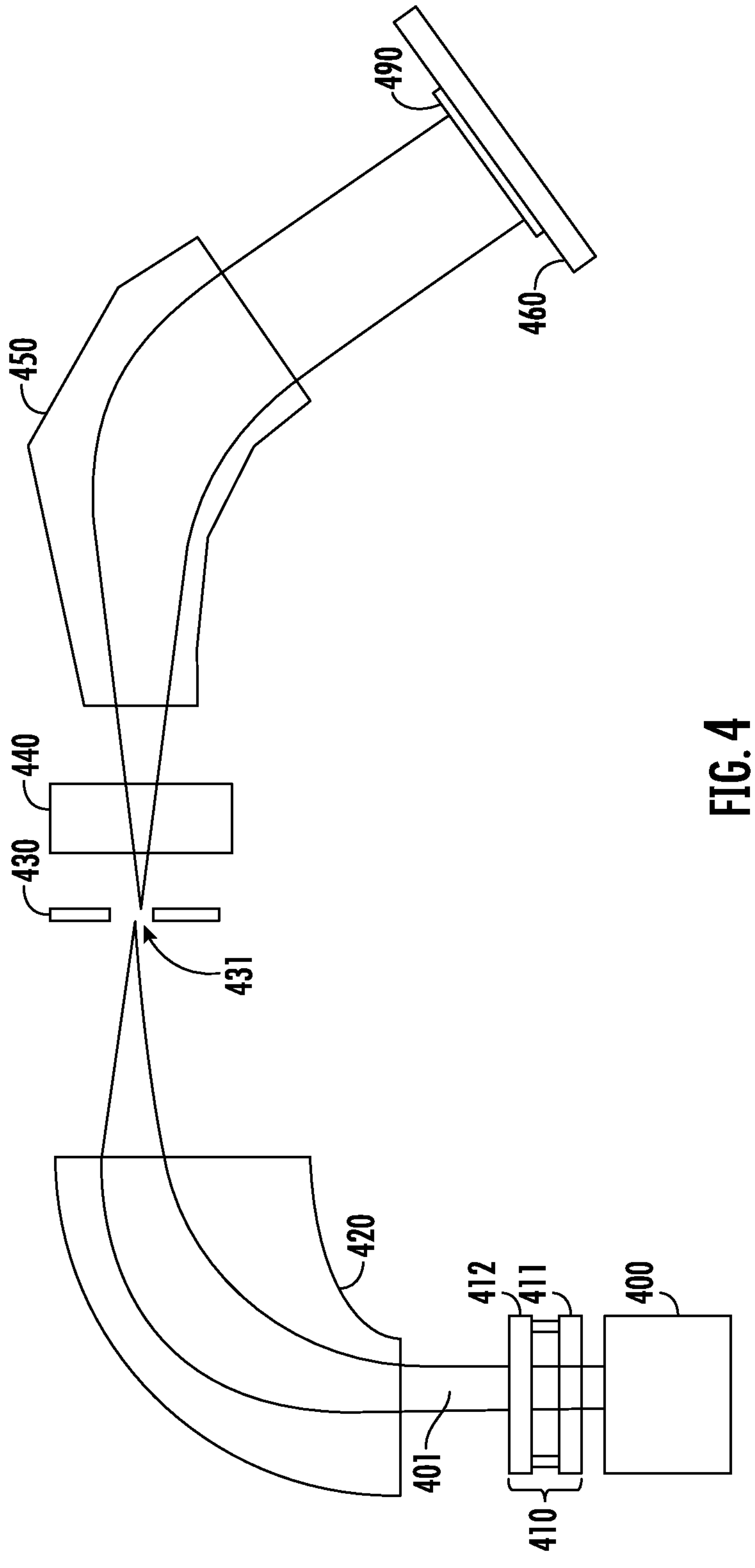
FIG. 4 shows an ion implanter that may utilize any of the ion sources described herein.

FIG. 4 shows an ion implanter that may utilize any of the ion sources described herein. The ion implanter includes an ion source 400, which may be any of the ion sources described above. As noted above, in certain embodiments, the ion source 400 may be an IHC ion source. In another embodiment, the ion source 400 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 100 MHz. Further, the power supplied by the RF power supply may be pulsed. Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 401 generated in the ion source chamber are extracted and directed toward a workpiece 490. The ions 401 may be of the desired dopant species, wherein the dopant containing material is part of or proximate to the second end of the ion source 400, as described above. The extraction aperture may be any suitable shape. In certain embodiments, the extraction aperture may be oval or rectangular shaped.

Disposed outside and proximate the extraction aperture of the ion source 400 are extraction optics 410. In certain embodiments, the extraction optics 410 comprise one or more electrodes. In certain embodiments, the extraction optics 410 comprises a suppression electrode 411, which is negatively biased relative to the plasma so as to attract ions through the extraction aperture. The suppression electrode 411 may be electrically biased using a suppression power supply. The suppression electrode 411 may be biased so as to be more negative than the extraction plate of the ion source 400.

In some embodiments, the extraction optics 410 includes a ground electrode 412. The ground electrode 412 may be disposed proximate the suppression electrode 411. The ground electrode 412 may be electrically connected to a second electrode power supply. In other embodiments, the ground electrode 412 may be electrically grounded so that the second electrode power supply is not used.

In other embodiments, the extraction optics 410 may comprise in excess of two electrodes, such as three electrodes or four electrodes. In these embodiments, the electrodes may be functionally and structurally similar to those described above, but may be biased at different voltages.

Located downstream from the extraction optics 410 is a mass analyzer 420. The mass analyzer 420 uses magnetic fields to guide the path of the extracted ions 401. The magnetic fields affect the flight path of ions according to their mass and charge. A mass resolving device 430 that has a resolving aperture 431 is disposed at the output, or distal end, of the mass analyzer 420. By proper selection of the magnetic fields, only those ions 401 that have a selected mass and charge will be directed through the resolving aperture 431. Other ions will strike the mass resolving device 430 or a wall of the mass analyzer 420 and will not travel any further in the system.

One or more beamline components may be disposed downstream from the mass resolving device 430 to direct the ions 401 toward the workpiece 490. For example, a collimator 440 may be disposed downstream from the mass resolving device 430. The collimator 440 accepts the extracted ions 401 that pass through the resolving aperture 431 and creates a ribbon ion beam formed of a plurality of parallel or nearly parallel beamlets. In other embodiments, the ion beam may be a spot beam. In this embodiment, an electrostatic scanner is used to move the spot beam in the first direction, as defined below.

Located downstream from the collimator 440 may be an acceleration/deceleration stage 450. The acceleration/deceleration stage 450 may be an electrostatic filter. The electrostatic filter is a beam-line lens component configured to independently control deflection, deceleration, and focus of the ion beam. Located downstream from the acceleration/deceleration stage 450 is the workpiece holder 460.

The workpiece 490, which may be, for example, a silicon wafer, a silicon carbide wafer, a gallium nitride wafer or another type of substrate, is disposed on the workpiece holder 460.

The present system has many advantages. First, this configuration, wherein at least one of the electrodes 130*a*, 130*b* are biased relative to the arc chamber 100, eliminates the need for a repeller. Consequently, a sputter target positioned at the second end 105 may be maintained at the same potential as the arc chamber 100. This simplifies the design and eliminates any connection between the sputter target and a power supply. Additionally, many prior art systems utilize a sputter target disposed on or around the repeller, which is either biased or floating. Since the sputter target of the present disclosure is not biased or floating, like these prior art implementations, its temperature may be lower, allowing more options of dopant containing material with low melting temperatures than may otherwise be used.

Furthermore, when using a sputter target disposed around a repeller, the repeller is typically located at the magnetic axis of the ion source, which also corresponds to the region of highest plasma density. Consequently, the sputter target material is not exposed to the highest density plasma, making it less effective at sputtering or etching material from the target. In the present disclosure, since a repeller is not used, the surface area of the sputter target that is exposed to the plasma may be maximized and the region of highest plasma density and highest etching rates can be utilized for the sputter target. For example, in one embodiment, the entirety of the second end serves as the sputter target.

Additionally, by using the entirety of the second end 105 as the sputter target, the life of the sputter target may be made significantly longer than other prior art implementations. Not only is the exposed surface area larger, but the thickness of the sputter target may be much thicker than conventional systems. Similarly, the insert 180 shown in FIG. 2 may also have extended life, since it may be screwed further into the arc chamber 100 as it is consumed.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An indirectly heated cathode (IHC) ion source to create an ion beam comprising a dopant species, wherein the dopant species is aluminum, comprising:

an arc chamber, comprising a plurality of electrically conductive side walls connecting a first end and a second end;

an indirectly heated cathode disposed on the first end of the arc chamber;

an electrode disposed on one of the plurality of electrically conductive side walls, wherein a voltage is applied to the electrode relative to a voltage applied to the plurality of electrically conductive side walls of the arc chamber; and wherein the second end is electrically connected to the side walls and an entirety of the second end is made of a dopant containing material, wherein the dopant containing material is a ceramic containing aluminum or an aluminum alloy.

2. The IHC ion source of claim 1, wherein the indirectly heated cathode is electrically connected to the side walls.

3. The IHC ion source of claim 1, wherein the dopant containing material has a melting point greater than a melting point of the dopant species.

4. The IHC ion source of claim 1, wherein the second end is at least 0.5 inches thick.

5. An ion implanter, comprising:

the IHC ion source of claim 1; and one or more beamline components to direct the ion beam toward a workpiece.

6. The ion implanter of claim 5, wherein the indirectly heated cathode is electrically connected to the side walls.

7. An indirectly heated cathode (IHC) ion source to generate an ion beam comprising a dopant species, comprising:

an arc chamber, comprising a plurality of electrically conductive side walls connecting a first end and a second end;

an indirectly heated cathode disposed on the first end of the arc chamber;

an electrode disposed on one of the plurality of electrically conductive side walls, wherein a voltage is applied to the electrode relative to a voltage applied to the plurality of electrically conductive side walls of the arc chamber; and wherein an opening is disposed in the second end, and an insert made from a dopant containing material is disposed in the opening and electrically connected to the second end, wherein the insert is configured to be extended into the arc chamber as it is consumed by a plasma in the arc chamber.

8. The IHC ion source of claim 7, wherein the indirectly heated cathode is electrically connected to the side walls.

9. The IHC ion source of claim 7, wherein the dopant containing material has a melting point greater than a melting point of the dopant species.

10. The IHC ion source of claim 7, wherein the dopant species is a metal and wherein the dopant containing material is a ceramic containing the dopant species or an alloy containing the dopant species.

11. The IHC ion source of claim 7, wherein the insert is at least 0.5 inches thick.

12. The IHC ion source of claim 7, wherein the dopant species is aluminum and the dopant containing material is a ceramic containing aluminum or an aluminum alloy.

13. The IHC ion source of claim 7, wherein the insert completely fills the opening.

14. The IHC ion source of claim 7, wherein a gap exists between the opening and the insert.

15. The IHC ion source of claim 7, further comprising a holder disposed at an exterior surface of the second end to retain the insert in position within the opening.

16. An ion implanter, comprising:

the IHC ion source of claim 7; and one or more beamline components to direct the ion beam toward a workpiece.

* * * * *